(12) United States Patent
Lin et al.

(10) Patent No.: US 10,217,724 B2
(45) Date of Patent: Feb. 26, 2019

(54) SEMICONDUCTOR PACKAGE ASSEMBLY WITH EMBEDDED IPD

(71) Applicant: MediaTek Inc., Hsin-Chu (TW)

(72) Inventors: Tzu-Hung Lin, Zhubei (TW); I-Hsuan Peng, Hsinchu (TW); Ching-Wen Hsiao, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/047,980

(22) Filed: Feb. 19, 2016

(65) Prior Publication Data

US 2016/0293581 A1  Oct. 6, 2016

Related U.S. Application Data

(60) Provisional application No. 62/157,046, filed on May 5, 2015, provisional application No. 62/139,932, filed on Mar. 30, 2015.

(51) Int. Cl.
*H01L 25/065* (2006.01)
*H01L 23/498* (2006.01)
(Continued)

(52) U.S. Cl.
CPC ...... *H01L 25/0657* (2013.01); *H01L 23/3157* (2013.01); *H01L 23/49811* (2013.01);
(Continued)

(58) Field of Classification Search
CPC ............ H01L 25/0657; H01L 23/3157; H01L 23/49811; H01L 23/49822;
(Continued)

(56) References Cited

U.S. PATENT DOCUMENTS 7,242,081 B1   7/2007  Lee
9,324,657 B2   4/2016  Seo et al.
(Continued)

FOREIGN PATENT DOCUMENTS

CN   101971326 A   2/2011
CN   102468257 A   5/2012
(Continued)

OTHER PUBLICATIONS

U.S. Appl. No. 15/331,016, filed Oct. 21, 2016, Lin et al.
U.S. Appl. No. 15/130,994, filed Apr. 17, 2016, Lin et al.

*Primary Examiner* — Fernando L Toledo
*Assistant Examiner* — Neil R Prasad
(74) *Attorney, Agent, or Firm* — Wolf, Greenfield & Sacks, P.C.

(57) ABSTRACT

The invention provides a semiconductor package assembly. The semiconductor package assembly includes a first semiconductor package including a first semiconductor die. A first redistribution layer (RDL) structure is coupled to the first semiconductor die. The first redistribution layer (RDL) structure includes a first conductive trace disposed at a first layer-level. A second conductive trace is disposed at a second layer-level. A first inter-metal dielectric (IMD) layer and a second inter-metal dielectric (IMD) layer, which is beside the first inter-metal dielectric (IMD) layer, are disposed between the first conductive trace and the second conductive trace.

25 Claims, 8 Drawing Sheets

(51) Int. Cl.
*H01L 23/538* (2006.01)
*H01L 23/00* (2006.01)
*H01L 25/10* (2006.01)
*H01L 25/16* (2006.01)
*H01L 23/31* (2006.01)
*H05K 1/18* (2006.01)

(52) U.S. Cl.
CPC .. *H01L 23/49822* (2013.01); *H01L 23/49827* (2013.01); *H01L 23/49833* (2013.01); *H01L 23/5389* (2013.01); *H01L 24/19* (2013.01); *H01L 24/20* (2013.01); *H01L 25/105* (2013.01); *H01L 25/16* (2013.01); *H01L 2224/04042* (2013.01); *H01L 2224/04105* (2013.01); *H01L 2224/12105* (2013.01); *H01L 2224/24137* (2013.01); *H01L 2224/24195* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06527* (2013.01); *H01L 2225/06544* (2013.01); *H01L 2225/06555* (2013.01); *H01L 2225/06568* (2013.01); *H01L 2225/1035* (2013.01); *H01L 2225/1041* (2013.01); *H01L 2225/1058* (2013.01); *H01L 2924/1434* (2013.01); *H01L 2924/1436* (2013.01); *H01L 2924/15311* (2013.01); *H01L 2924/19011* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01); *H05K 1/185* (2013.01)

(58) Field of Classification Search
CPC ......... H01L 23/49827; H01L 23/49833; H01L 23/5389; H01L 24/19; H01L 24/20; H01L 25/105; H01L 25/16; H01L 2224/04042; H01L 2224/04105; H01L 2224/12105; H01L 2224/24137; H01L 2224/24
See application file for complete search history.

(56) References Cited

U.S. PATENT DOCUMENTS

| | | | |
|---|---|---|---|
| 9,570,418 | B2 * | 2/2017 | Chen ................ H01L 24/19 |
| 9,633,974 | B2 * | 4/2017 | Zhai ................ H01L 25/0652 |
| 2003/0227095 | A1 | 12/2003 | Fujisawa et al. |
| 2007/0231962 | A1 | 10/2007 | Fujii |
| 2008/0041619 | A1 | 2/2008 | Lee et al. |
| 2008/0119013 | A1 | 5/2008 | Mangrum et al. |
| 2009/0237900 | A1 | 9/2009 | Origuchi et al. |
| 2010/0237495 | A1 | 9/2010 | Pagaila et al. |
| 2011/0068468 | A1 | 3/2011 | Lin et al. |
| 2012/0133032 | A1 | 5/2012 | Tsai et al. |
| 2013/0009320 | A1 | 1/2013 | Yoo et al. |
| 2013/0292808 | A1 | 11/2013 | Yen et al. |
| 2014/0015131 | A1 | 1/2014 | Meyer et al. |
| 2014/0035097 | A1 | 2/2014 | Lin et al. |
| 2015/0262902 | A1 * | 9/2015 | Shen ................ H01L 23/315 438/107 |
| 2016/0260684 | A1 | 9/2016 | Zhai et al. |
| 2016/0260693 | A1 * | 9/2016 | Lin ................ H01L 24/19 |
| 2016/0329299 | A1 | 11/2016 | Lin et al. |
| 2017/0040266 | A1 | 2/2017 | Lin et al. |

FOREIGN PATENT DOCUMENTS

| | | |
|---|---|---|
| CN | 104425465 A | 3/2015 |
| EP | 1648028 A1 | 4/2006 |
| WO | WO 2009/035962 | 3/2009 |
| WO | WO 2016-092692 A1 | 6/2016 |

\* cited by examiner

FIG. 4 ic application No. 62/139,932 filed on Mar. 30, 2015, and U.S.
SEMICONDUCTOR PACKAGE ASSEMBLY WITH EMBEDDED IPD

CROSS REFERENCE TO RELATED APPLICATIONS

This application claims the benefit of U.S. Provisional Application No. 62/139,932 filed on Mar. 30, 2015, and U.S. Provisional Application No. 62/157,046 filed on May 5, 2015, the entirety of which is incorporated by reference herein.

BACKGROUND OF THE INVENTION

Field of the Invention

The present invention relates to a semiconductor package assembly, and in particular to a semiconductor package assembly with a passive device.

Description of the Related Art

In order to ensure miniaturization and multi-functionality of electronic products and communication devices, it is desired that semiconductor packages be small in size, support multi-pin connection, operate at high speeds, and have high functionality. Additionally, in a high frequency application, such as a radio frequency (RF) system in package (SiP) assembly, one or more integrated passive devices (IPDs) are typically used to perform the functions.

In a conventional SiP assembly, passive devices are often placed on a printed circuit board (PCB) or on a package. However, the PCB is required to provide additional area for the passive devices mounted thereon. Additionally, the total height of the SiP assembly is increased when the passive devices are mounted on the package. As a result, it is difficult to reduce the size of the package assembly.

Thus, a novel semiconductor package assembly is desirable.

BRIEF SUMMARY OF THE INVENTION

A semiconductor package assembly is provided. An exemplary embodiment of a semiconductor package assembly includes a first semiconductor package. The first semiconductor package includes a first redistribution layer (RDL) structure having a first surface and a second surface opposite thereto. The first semiconductor package further includes a first semiconductor die disposed on the first surface of the first RDL structure. The first semiconductor package further includes a first molding compound disposed on the first surface of the first RDL structure and surrounding the first semiconductor die. The first semiconductor package further includes an integrated passive device (IPD) embedded in the first RDL structure and electrically coupled to the first semiconductor die through the first RDL structure.

Another exemplary embodiment of a semiconductor package assembly includes a first semiconductor package. The first semiconductor package includes a first redistribution layer (RDL) structure having a first surface and a second surface opposite thereto. The first semiconductor package further includes a first semiconductor die disposed on the first surface of the first RDL structure. The first semiconductor package further includes a first molding compound disposed on the first surface of the first RDL structure and surrounding the first semiconductor die. The first semiconductor package further includes a capacitor embedded in the first RDL structure and electrically coupled to the first semiconductor die through the first RDL structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1A:
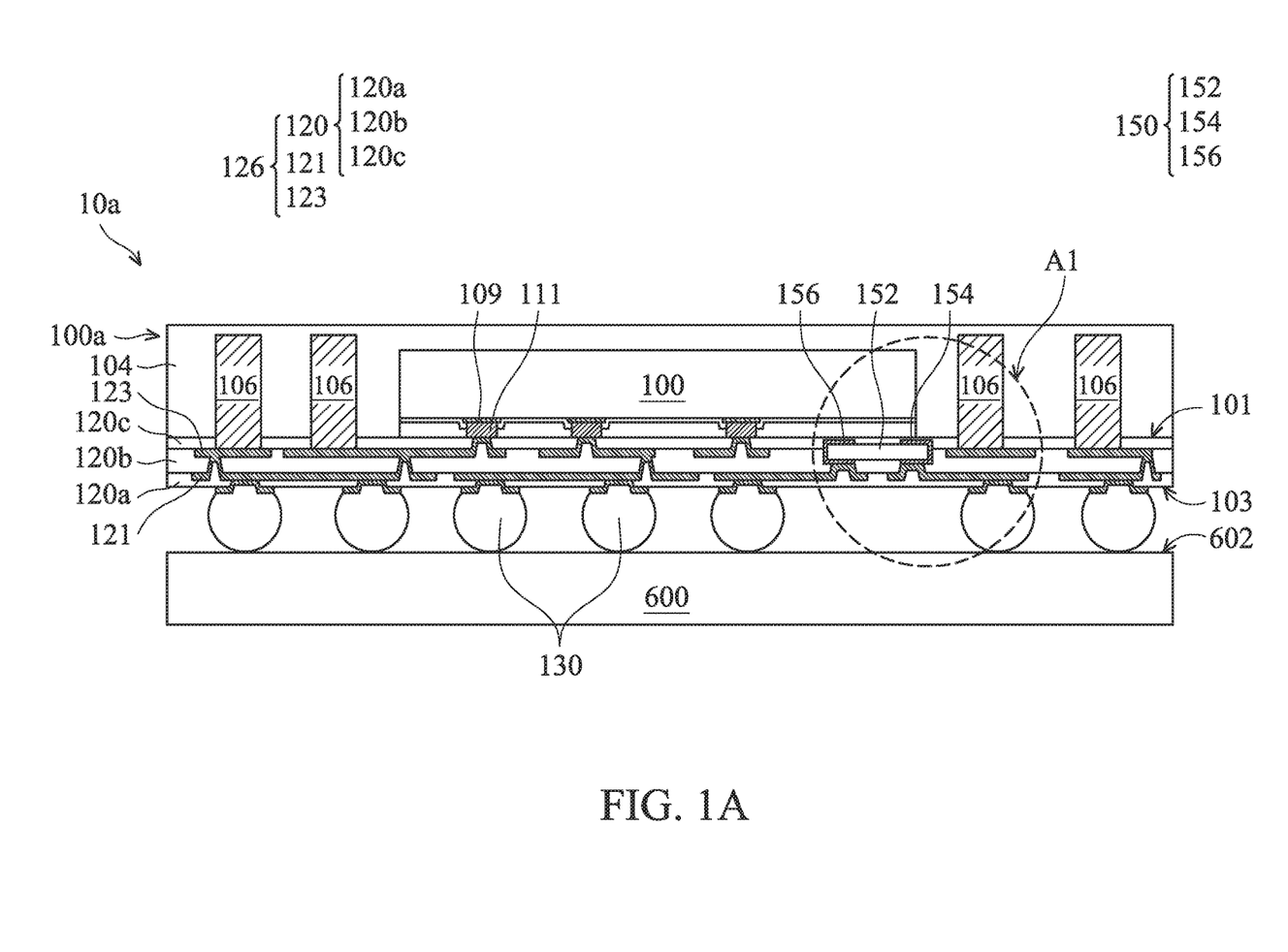
FIG. 1A is a cross-sectional view of an exemplary semiconductor package assembly in accordance with some embodiments of the disclosure.
Figure 1B:
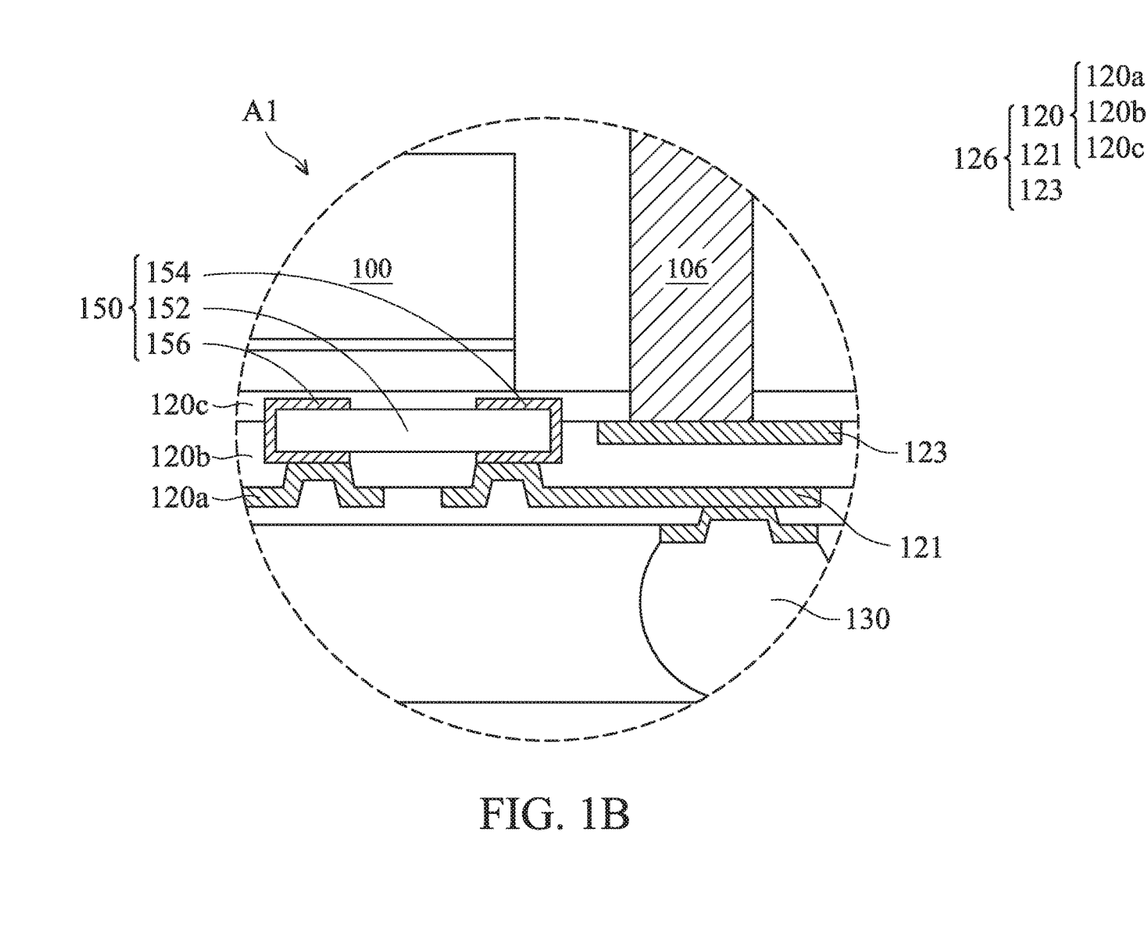
FIG. 1B is an enlarged view of an area A1 in FIG. 1A, showing a multi-layer ceramic capacitor (MLCC) embedded in an RDL structure.

FIG. 1A is a cross-sectional view of a semiconductor package assembly 10a in accordance with some embodiments of the disclosure. FIG. 1B is an enlarged view of an area A1 in FIG. 1A, showing a multi-layer ceramic capacitor (MLCC) 150 embedded in an RDL structure. In some embodiments, the semiconductor package assembly 10a is a wafer-level semiconductor package assembly, for example, a flip-chip semiconductor package assembly.

Referring to FIG. 1A, the semiconductor package assembly 10a includes at least one wafer-level semiconductor package 100a mounted on a base 600. In the embodiment, the wafer-level semiconductor package 100a includes a system-on-chip (SOC) package. Moreover, the base 600 includes a printed circuit board (PCB) and may be formed of polypropylene (PP). In some embodiment, the base 600 may include a package substrate.

In the embodiment, the base 600 may be a single layer or a multilayer structure. A plurality of conductive pads (not shown) and conductive traces (not shown) electrically coupled thereto are disposed on a surface 602 of the base 600 and/or in the base 600. In this case, the conductive traces may include signal trace segments and power/ground trace segments, which are used for the input/output (I/O) connections of the semiconductor package 100*a*. In one embodiment, the semiconductor package 100*a* is mounted directly on the conductive traces. In some embodiments, the conductive pads disposed on the surface 602 are connected to different terminals of the conductive traces. In this case, these conductive pads are used for the semiconductor package 100*a* mounted directly thereon.

The semiconductor package 100*a* is mounted on the surface 602 of the base 600 by a bonding process. For example, the semiconductor package 100*a* includes a plurality of conductive structures 130 that is mounted on and electrically coupled to the base 600 by the bonding process. The semiconductor package 100*a* includes a semiconductor die 100 (such as a SOC die) and an RDL structure 126. The SOC die, for example, may include a logic die including a central processing unit (CPU), a graphics processing unit (GPU), a dynamic random access memory (DRAM) controller or any combination thereof. Moreover, for example, the conductive structures 130 may comprise a conductive bump structure such as a copper bump or a solder bump structure, a conductive pillar structure, a conductive wire structure, or a conductive paste structure.

As shown in FIG. 1A, the semiconductor die 100 is fabricated by flip-chip technology. Pads 109 of the semiconductor die 100 are electrically connected to the circuitry (not shown) of the semiconductor die 100. In some embodiments, the pads 109 belong to the uppermost metal layer of the interconnection structure (not shown) of the semiconductor die 100. The pads 109 of the semiconductor die 100 are in contact with the corresponding conductive structures 111, for example, conductive bumps, posts or solder pastes. It should be noted that the number of semiconductor dies 100 integrated in the semiconductor package assembly 10*a* is not limited to that disclosed in the embodiment.

The RDL structure 126, which is also referred to as a fan-out structure, has a first surface 101 and a second surface 103 opposite thereto. The semiconductor die 100*a* is disposed on the first surface 101 of the RDL structure 126. The semiconductor die 100 of the semiconductor package 100*a* is connected to the RDL structure 126 through conductive structures 111.

In the embodiment, the RDL structure 126 includes one or more conductive traces disposed in an inter-metal dielectric (IMD) layer 120. For example, a plurality of first conductive traces 123 is disposed at a first layer-level of the IMD layer 120 and at least one of the plurality of first conductive traces 123 is electrically coupled to the semiconductor die 100. Moreover, a plurality of second conductive traces 121 is disposed at a second layer-level different from the first layer-level of the IMD layer 120. In this case, the IMD layer 120 may include first, second, third sub-dielectric layers 120*a*, 120*b*, and 120*c* successively stacked from the second surface 103 of the RDL structure 126 toward the first surface 101 of the RDL structure 126, such that the first conductive traces 123 are positioned on the third sub-dielectric layer 120*c* and the second conductive traces 121 are positioned on the second sub-dielectric layer 120*b* and covered by the first sub-dielectric layer 120*a*. Also, the first conductive traces 123 are separated from the second conductive trace 121 by the second sub-dielectric layer 120*b*. In some embodiments, the IMD layer 120 may be formed of organic materials, which include a polymer base material, non-organic materials, which include silicon nitride ($SiN_x$), silicon oxide ($SiO_x$), graphene, or the like. For example, the first, second, third sub-dielectric layers 120*a*, 120*b*, and 120*c* are made of a polymer base material, in which the first sub-dielectric layer 120*a* has a thickness of about 12 μm and the second sub-dielectric layer 120*b* has a thickness of about 24 μm.

In some embodiments, the IMD layer 120 is a high-k dielectric layer (k is the dielectric constant of the dielectric layer). In some other embodiments, the IMD layer 120 may be formed of a photo sensitive material, which includes a dry film photoresist, or a taping film.

Pad portions of the second conductive traces 121 are exposed to openings of the first sub-dielectric layers 120*a* and connected to the conductive structures 130 that are disposed on the second surface 103 of the RDL structure 126. Also, it should be noted that the number of conductive traces and the number of sub-dielectric layers of the RDL structure 126 shown in FIG. 1A is only an example and is not a limitation to the present invention.

In the embodiment, the semiconductor package 100*a* further includes at least one electronic component, such as an integrated passive device (IPD), embedded in the RDL structure 126. The IPD is electrically coupled to the semiconductor die 100 through the RDL structure 126. In some embodiments, the IPD may include a capacitor, an inductor, a resistor, or a combination thereof. Moreover, the IPD includes at least one electrode electrically coupled to one of the plurality of second conductive traces 121.

In the embodiment, for example, the IPD may be a capacitor, such as a multi-layer ceramic capacitor (MLCC) 150, as shown in FIGS. 1A and 1B. The MLCC 150 is electrically coupled to the semiconductor die 100. In this case, the MLCC 150 includes a body 152 and first and second electrode layers 154 and 156 respectively disposed on two ends of the body 152. Moreover, sidewalls, portions of an upper surface, and a lower surface of the body 152 are covered by the first and second electrode layers 154 and 156. The first and second electrode layers 154 and 156 are respectively electrically coupled to at least two of the second conductive traces 121.

In the embodiment, as shown in FIG. 1A, the semiconductor package 100*a* further includes a molding compound 104 disposed on the first surface 101 of the RDL structure 126 and covering and surrounding the semiconductor die 100. In some embodiments, the molding compound 104 may be formed of an epoxy, a resin, a moldable polymer, or the like. The molding compound 104 may be applied while substantially liquid, and then may be cured through a chemical reaction, such as in an epoxy or resin. In some other embodiments, the molding compound 104 may be an ultraviolet (UV) or thermally cured polymer applied as a gel or malleable solid capable of being disposed around the semiconductor die 100, and then may be cured through a UV or thermal curing process. The molding compound 104 may be cured with a mold (not shown).

In the embodiment, the molding compound 104 includes vias 106 passing through therein. The vias 106 are electrically coupled to the second conductive traces 121 of the RDL structure 126. Moreover, the semiconductor die 100 may be surrounded by the vias 106. In some embodiments, the vias 106 may comprise through package vias (TPVs) formed of copper.

Also, the conductive structures 130 are separated from the molding compound 104 through the RDL structure 126. In other words, the conductive structures 130 are free from contact with the molding compound 104. In some embodiments, the conductive structures 130 may comprise a conductive bump structure (such as a copper or solder bump structure), a conductive pillar structure, a conductive wire structure, or a conductive paste structure.

According to the embodiments, the semiconductor package assembly 10a is designed to fabricate an IPD structure, for example, the MLCC 150 embedded in the RDL structure 126. The MLCC 150 provides a comparable process capability in the semiconductor package assembly. Also, the semiconductor package assembly 10a may help to improve the surface-mount technology (SMT) yield even when the semiconductor die (e.g., the semiconductor die 100) is replaced. Additionally, the signal integrity/power integrity (SI/PI) performance of the embedded MLCC 150 can be improved due to the shortened routing path between the semiconductor die (e.g., the semiconductor die 100) and the MLCC 150. The embedded MLCC 150 can provide design flexibility for the system integration of the semiconductor package assembly 10a.

Figure 1C:
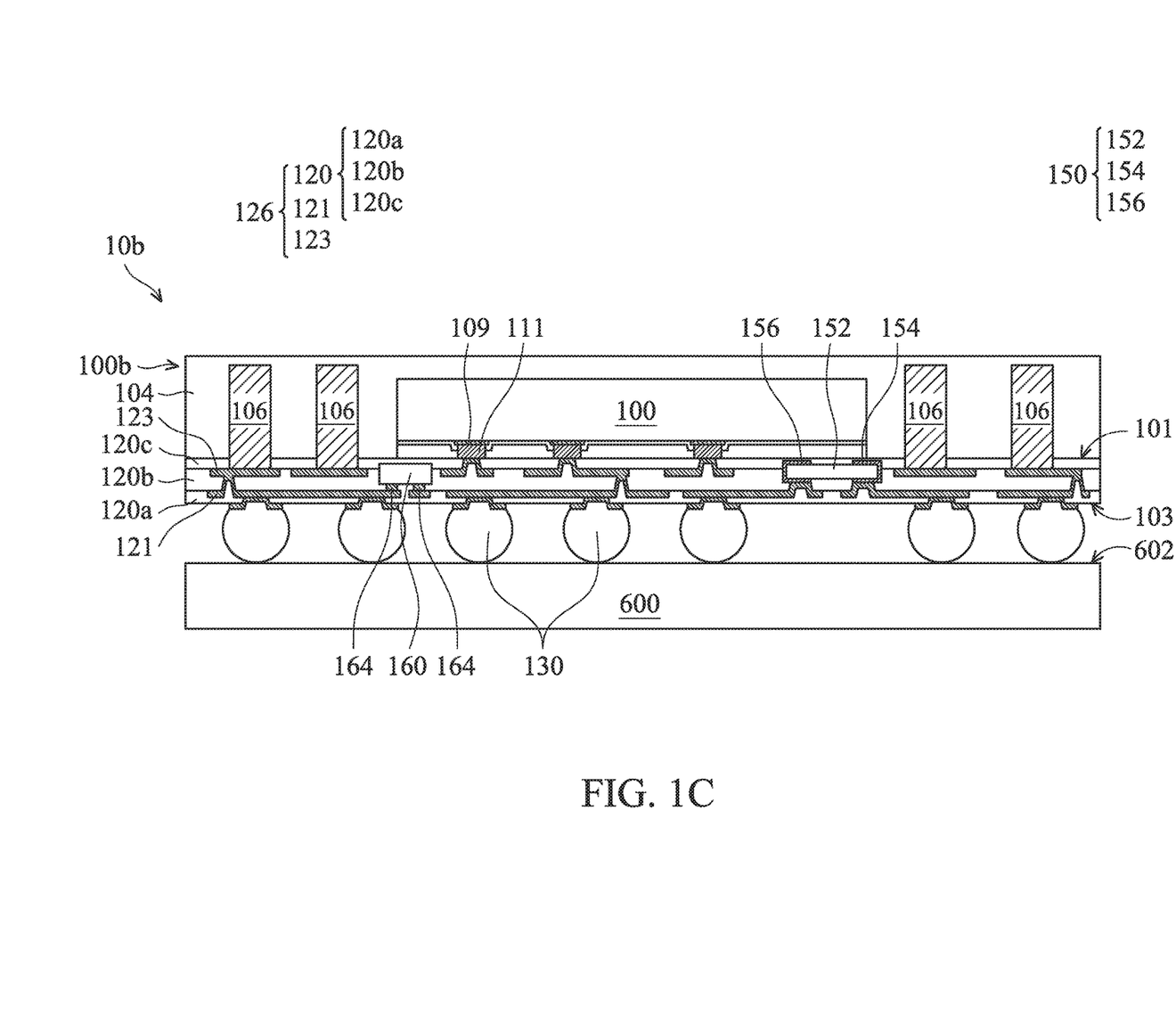
FIG. 1C is a cross-sectional view of an exemplary semiconductor package assembly in accordance with some embodiments of the disclosure.

FIG. 1C is a cross-sectional view of an exemplary semiconductor package assembly 10b in accordance with some embodiments of the disclosure. Descriptions of elements of the embodiments hereinafter that are the same as or similar to those previously described with reference to FIG. 1A are omitted for brevity. In the embodiment, the semiconductor package assembly 10b is similar to the semiconductor package assembly 10a shown in FIG. 1A, except a semiconductor package 100b of the semiconductor package assembly 10b further includes a semiconductor die 160, such as an SOC die, embedded in the RDL structure 126. The semiconductor die 160 is electrically coupled to the semiconductor die 100 through the RDL structure 126.

Moreover, the semiconductor die 160 includes at least one pad electrically coupled to one of the plurality of second conductive traces 121. For example, the semiconductor die 160 includes pads 164 that are electrically coupled to the second conductive traces 121.

According to this embodiment, the semiconductor package assembly 10b is designed to fabricate an IPD structure (i.e., the MLCC 150) and a semiconductor die 160 embedded in the RDL structure 126. The MLCC 150 and the semiconductor die 160 provides a comparable process capability in the semiconductor package assembly. Also, the semiconductor package assembly 10b may help to improve the SMT yield even when the semiconductor die (e.g., the semiconductor die 100) is replaced. Additionally, the SI/PI performance of the embedded MLCC 150 and semiconductor die 160 can be improved due to the shortened routing path between the semiconductor die (e.g., the semiconductor die 100) and the MLCC 150 and semiconductor die 160. The embedded MLCC 150 and semiconductor die 160 can provide design flexibility for the system integration of the semiconductor package assembly 10b.

Figure 2A:
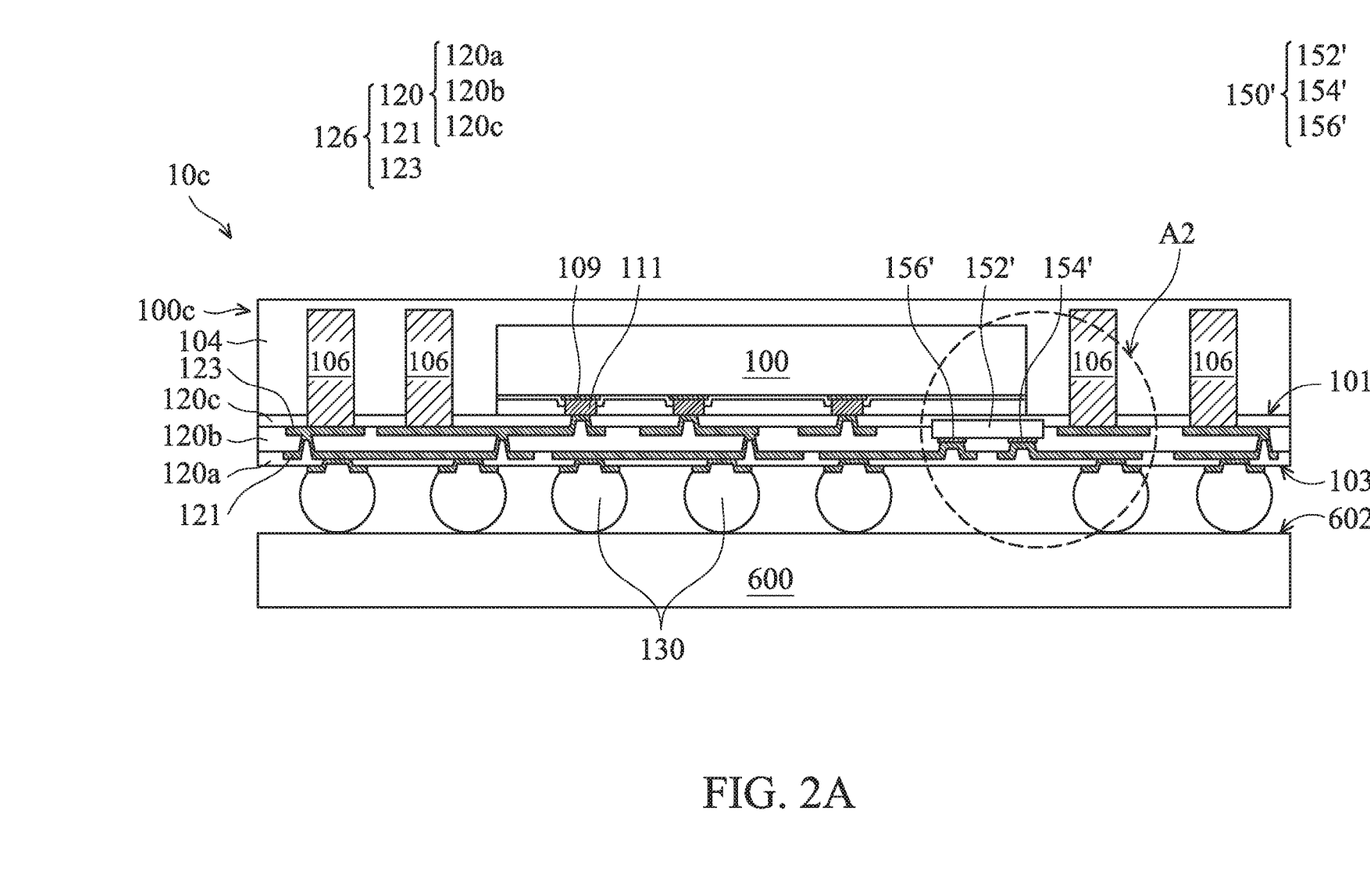
FIG. 2A is a cross-sectional view of an exemplary semiconductor package assembly in accordance with some embodiments of the disclosure.
Figure 2B:
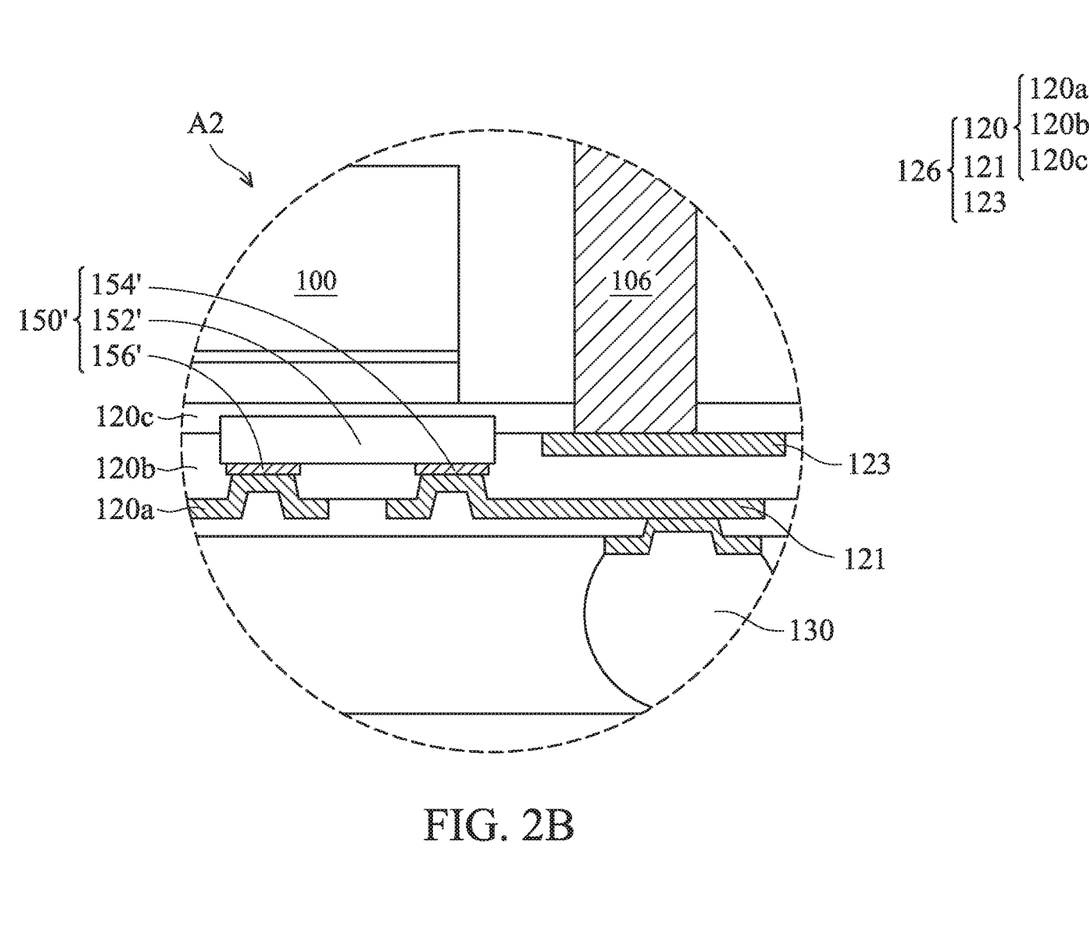
FIG. 2B is an enlarged view of an area A2 in FIG. 2A, showing a chip-cap capacitor embedded in an RDL structure.

FIG. 2A is a cross-sectional view of an exemplary semiconductor package assembly 10c in accordance with some embodiments of the disclosure. FIG. 2B is an enlarged view of an area A2 in FIG. 2A, showing a chip-cap capacitor 150' embedded in an RDL structure. Descriptions of elements of the embodiments hereinafter that are the same as or similar to those previously described with reference to FIGS. 1A and 1B are omitted for brevity.

In the embodiment, the semiconductor package assembly 10c is similar to the semiconductor package assembly 10a shown in FIG. 1A, except the semiconductor package 100c of the semiconductor package assembly 10c includes a chip-cap capacitor 150', that replaces the MLCC 150 shown in FIGS. 1A and 1B to be embedded in the RDL structure 126.

Also, the chip-cap capacitor 150' is electrically coupled to the semiconductor die 100. In this case, the chip-cap capacitor 150' includes a body 152' and first and second electrode layers 154' and 156' respectively disposed on two ends of the body 152'. Moreover, the first and second electrode layers 154' and 156' expose sidewalls, portions of a lower surface of the body 152'. The first and second electrode layers 154' and 156' are respectively electrically coupled to at least two of the second conductive traces 121.

According to the embodiments, the semiconductor package assembly 10c is designed to fabricate an IPD structure, for example, the chip-cap capacitor 150' embedded in the RDL structure 126. The chip-cap capacitor 150' provides a comparable process capability in the semiconductor package assembly. Similarly, the semiconductor package assembly 10c may help to improve the SMT yield even when the semiconductor die (e.g., the semiconductor die 100) is replaced. Additionally, the SI/PI performance of the embedded chip-cap capacitor 150' can be improved due to the shortened routing path between the semiconductor die (e.g., the semiconductor die 100) and the chip-cap capacitor 150'. The embedded chip-cap capacitor 150' can provide design flexibility for the system integration of the semiconductor package assembly 10c.

Figure 2C:
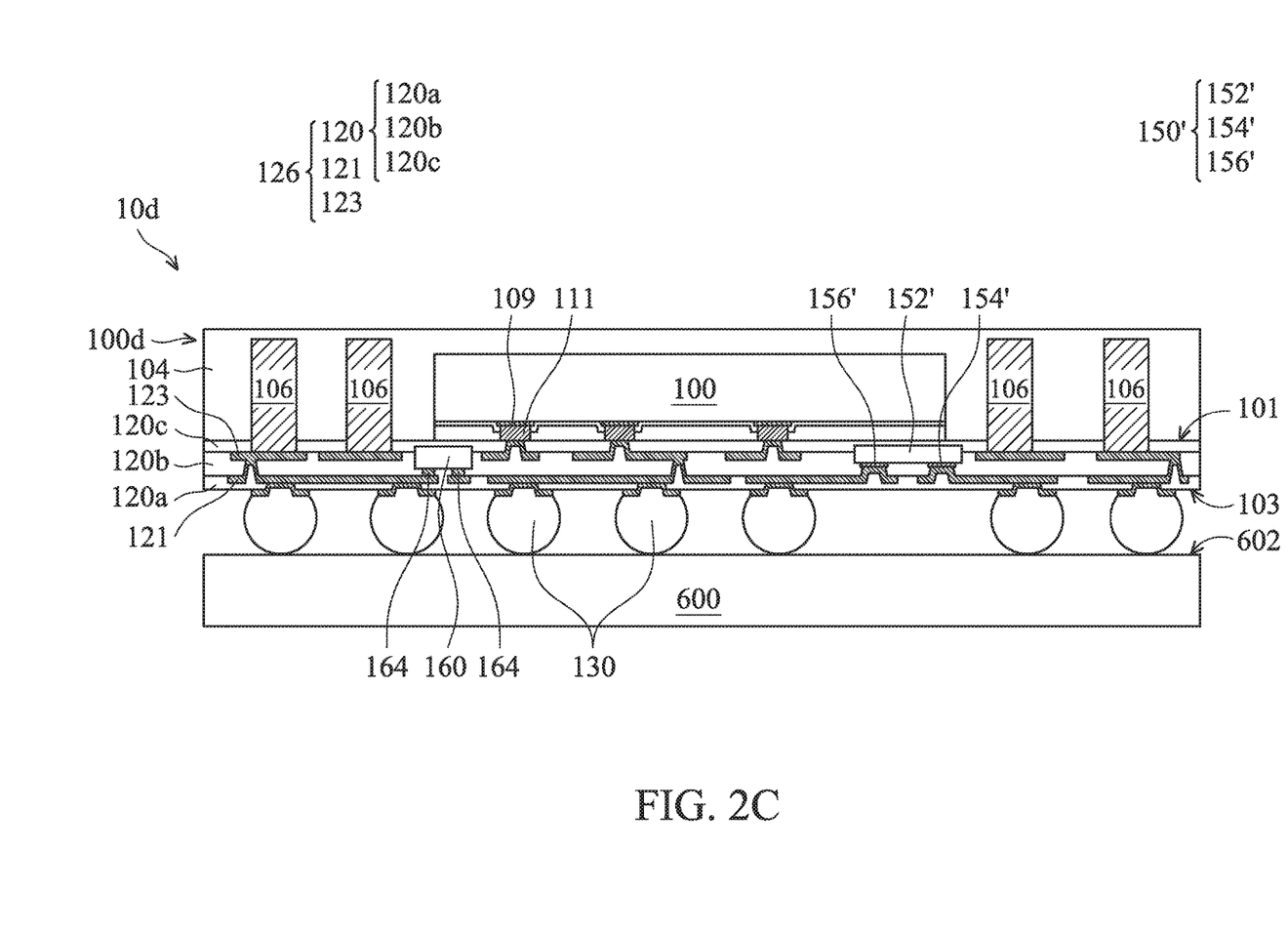
FIG. 2C is a cross-sectional view of an exemplary semiconductor package assembly in accordance with some embodiments of the disclosure.

FIG. 2C is a cross-sectional view of an exemplary semiconductor package assembly 10d in accordance with some embodiments of the disclosure. Descriptions of elements of the embodiments hereinafter that are the same as or similar to those previously described with reference to FIG. 1C are omitted for brevity. In the embodiment, the semiconductor package assembly 10d is similar to the semiconductor package assembly 10c shown in FIG. 2A, except a semiconductor package 100d of the semiconductor package assembly 10d further includes a semiconductor die 160, such as an SOC die, embedded in the RDL structure 126. The semiconductor die 160 is electrically coupled to the semiconductor die 100 through the RDL structure 126. Moreover, for example, the semiconductor die 160 includes pads 164 that are electrically coupled to the second conductive traces 121.

According to this embodiment, the semiconductor package assembly 10d is designed to fabricate an IPD structure (i.e., the chip-cap capacitor 150') and a semiconductor die 160 embedded in the RDL structure 126. The chip-cap capacitor 150' and the semiconductor die 160 provides a comparable process capability in the semiconductor package assembly. Also, the semiconductor package assembly 10d may help to improve the SMT yield even when the semiconductor die (e.g., the semiconductor die 100) is replaced. Additionally, the SI/PI performance of the embedded chip-cap capacitor 150' and semiconductor die 160 can be improved due to the shortened routing path between the semiconductor die (e.g., the semiconductor die 100) and the chip-cap capacitor 150' and semiconductor die 160. The embedded chip-cap capacitor 150' and semiconductor die 160 can provide design flexibility for the system integration of the semiconductor package assembly 10d.

Figure 3:
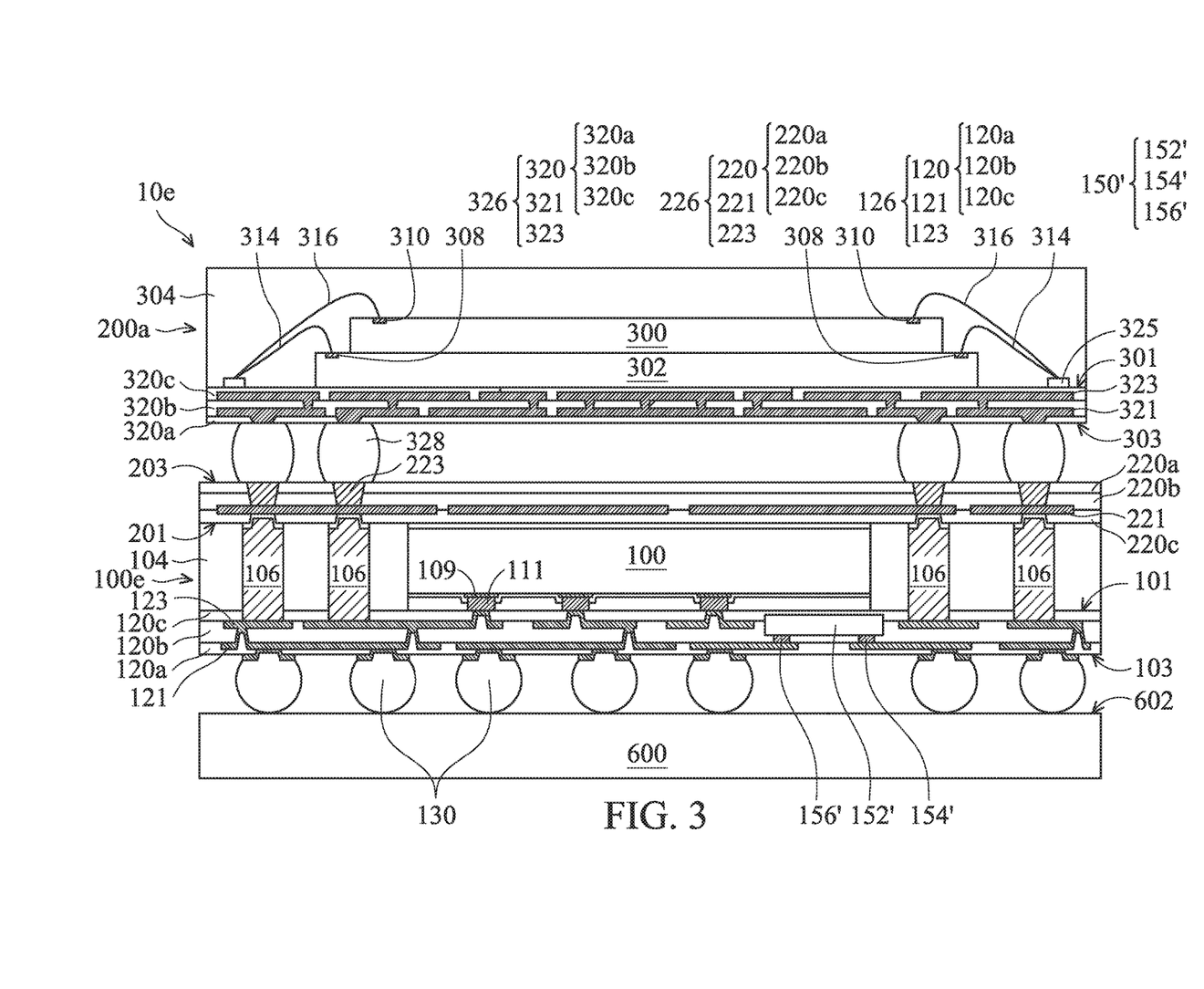
FIG. 3 is a cross-sectional view of a semiconductor package assembly including a package on package (PoP) structure in accordance with some embodiments of the disclosure.

FIG. 3 is a cross-sectional view of a semiconductor package assembly including a package on package (PoP) structure in accordance with some embodiments of the disclosure. Descriptions of elements of the embodiments hereinafter that are the same as or similar to those previously described with reference to FIGS. 1A-1C or 2A-2C are omitted for brevity. In the embodiment, the semiconductor package 100e is similar to the semiconductor package 100c shown in FIG. 2A, except the semiconductor package 100e further includes a RDL structure 226 disposed on the semiconductor die 100 and the molding compound 104, such that the RDL structure 226 is separated from the RDL structure 126 by the semiconductor die 100 and the molding compound 104. Moreover, the vias 106 passing through the molding compound 104 form an electrical connection between the RDL structures 126 and 226.

The RDL structure 226 has a first surface 201 and a second surface 203 opposite thereto. The first surface 201 of the RDL structure 226 is disposed on the semiconductor die 100 and the molding compound 104. Namely, compared to the second surface 203, the first surface 201 is close to the semiconductor die 100 and is in contact with the molding compound 104. Like the RDL structure 126, the RDL structure 226 may one or more conductive traces disposed in an IMD layer 220. For example, a plurality of conductive traces 221 and a plurality of vias 223 are disposed in the IMD layer 220 and at least one of the plurality of conductive traces 221 is electrically coupled to the via 106. In this case, the IMD layer 220 is similar to the IMD layer 120 and may include first, second, third sub-dielectric layers 220a, 220b, and 220c successively stacked from the second surface 203 of the RDL structure 226 toward the first surface 201 of the RDL structure 2262. Also, the IMD layer 220 may be formed of a material the same as or similar to that of the IMD layer 120.

Figure 4:
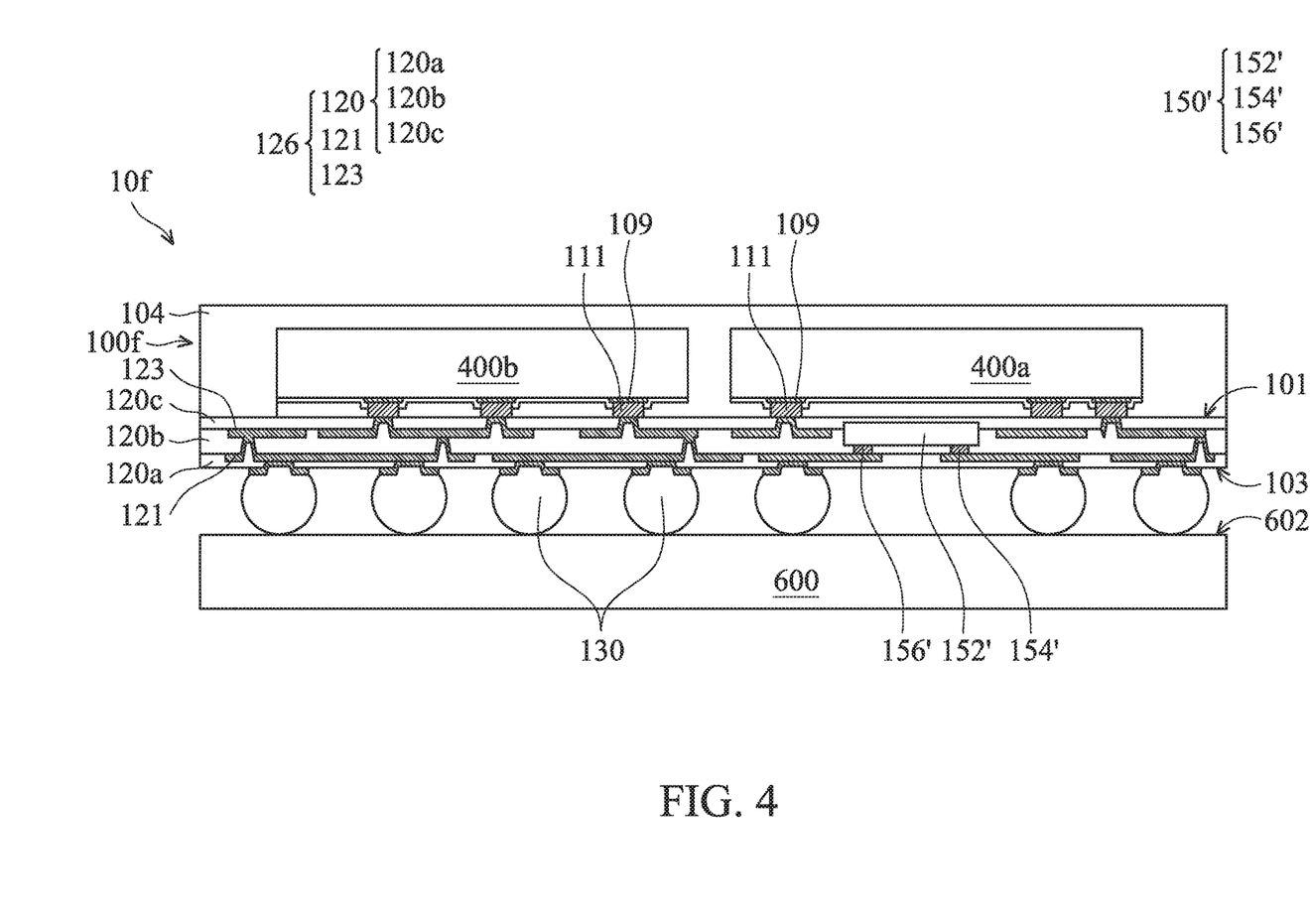
FIG. 4 is a cross-sectional view of a semiconductor package assembly including a system-on-chip (SOC) package with two semiconductor dies arranged side-by-side in accordance with some other embodiments of the disclosure.

Pad portions of the conductive traces 221 are exposed to openings of the third sub-dielectric layer 220c. It should be noted that the number of conductive traces 221 and vias 223 and the number of sub-dielectric layers of the IMD layer 220 shown in FIG. 3 is only an example and is not a limitation to the present invention. As shown in FIG. 4, the RDL structure 226 is coupled to the RDL structure 126 by vias 106 passing through the molding compound 104 between the RDL structure 126 and the RDL structure 226.

In some embodiments, the chip-cap capacitor 150' embedded in the RDL structure 126 may be replaced by the MLCC 150, as shown in FIG. 1A. In some embodiments, a semiconductor die 160 and the chip-cap capacitor 150' or the MLCC 150 may be embedded in the RDL structure 126 together, as shown in FIG. 1C or 2C.

In the embodiment, as shown in FIG. 3, the semiconductor package assembly 10e includes a semiconductor package 200a stacked on the semiconductor package 100e (e.g., an SOC package) by a bonding process. The semiconductor package 200a may include a memory package, for example, a dynamic random access memory (DRAM) package. The semiconductor package 200a includes a plurality of conductive structures 328 mounted on the semiconductor package 100e. The Semiconductor package 200a is coupled to the RDL structure 126 by the RDL structure 226 and the vias 106 of the semiconductor package 100e.

In the embodiment, as shown in FIG. 3, the semiconductor package 200a comprises a RDL structure 326, at least one semiconductor die (e.g., two DRAM dies 300 and 302) and a molding compound 304. The RDL structure 326 has opposite surfaces 301 and 303. The surface 301 is provided for semiconductor dies mounted thereon, and the surface 303 is provided for conductive structures 328 (such as bumps) attached thereon.

Like the RDL structure 126, the RDL structure 326 may one or more conductive traces disposed in an IMD layer 320. For example, a plurality of first conductive traces 321 and a plurality of second conductive traces 323 are disposed at different layer-levels of the IMD layer 320. The structure and material of the IMD layer 320 are similar to that of the IMD layer 120. For example, the IMD layer 320 may include first, second, third sub-dielectric layers 320a, 320b, and 320c successively stacked from the surface 303 of the RDL structure 326 toward the surface 301 of the RDL structure 326.

Pad portions of the first conductive traces 321 are exposed to openings of the first sub-dielectric layer 320a. It should be noted that the number of conductive traces and the number sub-dielectric layers of the IMD layer 326 shown in FIG. 3 is only an example and is not a limitation of the present invention In this embodiment as shown in FIG. 4, the semiconductor dies 302 and 300 are successively stacked on the surface 301 of the RDL structure 326, in which the semiconductor die 302 is mounted on the RDL structure 326 with a paste (not shown). Also, the semiconductor die 300 is stacked on the semiconductor die 302 with a paste (not shown). The semiconductor die 302 has pads 308 thereon, and the semiconductor die 300 has pads 410 thereon.

The pads 308 and 310 may be coupled to pads 325 of the RDL structure 326 by bonding wires, such as bonding wires 314 and 316, respectively. It should be noted that the number of stacked semiconductor dies in the semiconductor package 200a is not limited to the disclosed embodiment. Alternatively, the two semiconductor dies 300 and 302 may be arranged side by side.

In the embodiment, the molding compound 304 is disposed on the surface 301 of the RDL structure 326. Moreover, the molding compound 304 covers and surrounds the two semiconductor dies 300 and 302. The molding compound 412 may be formed of a material the same as or similar to that of the molding compound 104.

As shown in FIG. 3, conductive structures 328 are disposed on the surface 303 of the RDL structure 326 and electrically coupled between the first conductive trace 321 of the RDL structure 326 and the vias 223 of the RDL structure 226. The semiconductor package 200a is electrically coupled to the RDL structure 126 of the semiconductor package 100e. Like conductive structures 130, conductive structures 328 may include a copper or solder bump structure, a conductive pillar structure, a conductive wire structure, or a conductive paste structure.

FIG. 4 is a cross-sectional view of a semiconductor package assembly 10f including a semiconductor package 100f with two semiconductor dies 400a and 400b arranged side-by-side in accordance with some other embodiments of the disclosure. Descriptions of elements of the embodiments hereinafter that are the same as or similar to those previously described with reference to FIGS. 1A-1B or 2A-2B are omitted for brevity. In the embodiment, as shown in FIG. 4, the semiconductor package 100f may be an SOC package of the semiconductor package assembly 100f and include two semiconductor dies 400a and 400b arranged side-by-side. In some embodiments, at least one of the semiconductor dies 400a and 400b is a SOC die. For example, the semiconductor dies 400a and 400b are SOC die. Alternatively, the semiconductor die 402a is a SOC die, and the semiconductor dies 402b is a memory die, such as a DRAM die.

In some embodiments, an IPD, such as the chip-cap capacitor 150', is embedded in the RDL structure 126 and coupled to the SOC die (e.g., the semiconductor die 402a). Therefore, the semiconductor package 100f of the semiconductor package assembly 10f includes a pure SOC package or a hybrid SOC package. However, the number and the arrangement of semiconductor dies are not limited to the disclosed embodiment.

In some embodiments, the chip-cap capacitor 150' embedded in the RDL structure 126 may be replaced by the MLCC 150, as shown in FIG. 1A. In some embodiments, a semiconductor die 160 and the chip-cap capacitor 150' or the MLCC 150 may be embedded in the RDL structure 126 together, as shown in FIG. 1C or 2C.

Embodiments shown in FIGS. 3 and 4 provide a semiconductor package assembly. In some embodiments, the semiconductor package assembly is designed to fabricate an IPD, for example, an MLCC or chip-cap capacitor embedded in an RDL structure. The semiconductor package assembly may help to improve the SMT yield even when the semiconductor die (the SOC die) is replaced. Additionally, the SI/PI performance of the embedded IPD can be improved due to the shortened routing path between the semiconductor die (the SOC die) and the IPD. The embedded IPD can provide the design flexibility for the system integration of the semiconductor package assembly.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
    a first semiconductor package, comprising:
        a first redistribution layer (RDL) structure having a first surface and a second surface opposite thereto;
        a first semiconductor die disposed on the first surface of the first RDL structure;
        a first molding compound disposed on the first surface of the first RDL structure and surrounding the first semiconductor die; and
        an integrated passive device (IPD) embedded in the first RDL structure, wherein:
            the IPD is electrically coupled to the first semiconductor die located above the IPD through the first RDL structure,
            the IPD comprises first and second electrode layers disposed respectively at least on first and second portions of a lower surface of a body of the IPD, and
            the first electrode layer of the IPD is electrically coupled to a first conductive trace of the first RDL structure and the second electrode layer of the IPD is electrically coupled to a second conductive trace of the first RDL structure, the first and second conductive traces being located below the body of the IPD.

2. The semiconductor package assembly as claimed in claim 1, wherein the
    first semiconductor package further comprises a second semiconductor die entirely embedded in the first RDL structure.

3. The semiconductor package assembly as claimed in claim 1, wherein the first semiconductor package further comprises a plurality of first conductive structures disposed on the second surface of the first RDL structure and electrically coupled to the first RDL structure.

4. The semiconductor package assembly as claimed in claim 3, further comprising a printed circuit board electrically coupled to the plurality of first conductive structures.

5. The semiconductor package assembly as claimed in claim 1, wherein the first RDL structure comprises:
    a first inter-metal dielectric (IMD) layer; and
    a plurality of third conductive traces at a first layer-level of the first IMD layer and one of the plurality of third conductive traces electrically coupled to the first semiconductor die,
    wherein the first and second conductive traces are at a second layer-level different from the first layer-level of the first IMD layer.

6. The semiconductor package assembly as claimed in claim 1, wherein the IPD comprises a capacitor, an inductor, a resistor, or a combination thereof.

7. The semiconductor package assembly as claimed in claim 1, wherein the first semiconductor package comprises:
    a second RDL structure disposed on the first semiconductor die and the first molding compound, such that the second RDL structure is separated from the first RDL structure by the first semiconductor die and the first molding compound; and
    a plurality of first vias passing through the first molding compound to form an electrical connection between the first and second RDL structures.

8. The semiconductor package assembly as claimed in claim 7, further comprising:
    a second semiconductor package stacked on the first semiconductor package, comprising:
        a third RDL structure electrically coupled to the second RDL structure and having a third surface and a fourth surface opposite thereto;
        a third semiconductor die disposed on the third surface of the third RDL structure; and
        a second molding compound disposed on the third surface of the third RDL structure and surrounding the third semiconductor die.

9. The semiconductor package assembly as claimed in claim 8, wherein the second semiconductor package further comprises a plurality of second conductive structures disposed on the fourth surface of the third RDL structure and electrically coupled to the second RDL structure.

10. The semiconductor package assembly as claimed in claim 8, wherein the first semiconductor package is a system-on-chip (SOC) package, and the second semiconductor package is a dynamic random access memory (DRAM) package.

11. The semiconductor package assembly as claimed in claim 1, wherein the first semiconductor package further comprises a fourth semiconductor die disposed on the first surface of the first RDL structure, such that the first and fourth semiconductor dies are arranged side-by-side.

12. The semiconductor package assembly as claimed in claim 11, wherein the first semiconductor die is an SOC die, and the fourth semiconductor die is a DRAM die.

13. A semiconductor package assembly, comprising:
    a first semiconductor package, comprising:
        a first redistribution layer (RDL) structure having a first surface and a second surface opposite thereto;
        a first semiconductor die disposed on the first surface of the first RDL structure;
        a first molding compound disposed on the first surface of the first RDL structure and surrounding the first semiconductor die; and
        an electronic component embedded in the first RDL structure, wherein:

the electronic component is electrically coupled to the first semiconductor die located above the electronic component through the first RDL structure, and the electronic component is electrically coupled to one or more first conductive traces of the first RDL structure, the one or more first conductive traces being located below a body of the electronic component.

14. The semiconductor package assembly as claimed in claim 13, wherein the first RDL structure comprises:

a first inter-metal dielectric (IMD) layer;

a plurality of second conductive traces at a first layer-level of the first IMD layer and one of the plurality of second conductive traces electrically coupled to the first semiconductor die; and the one or more first conductive traces at a second layer-level different from the first layer-level of the first IMD layer, wherein the one or more first conductive traces comprise a third conductive trace and a fourth conductive trace, and the electronic component comprises a first electrode layer that is electrically coupled to the third conductive trace and a second electrode layer that is electrically coupled to the fourth conductive trace.

15. The semiconductor package assembly as claimed in claim 14, wherein:

the electronic component is a multi-layer ceramic capacitor, and the first and second electrode layers are respectively disposed on first and second ends of the body, such that sidewalls, portions of an upper surface, and a lower surface of the body are covered by the first and second electrode layer.

16. The semiconductor package assembly as claimed in claim 14, wherein: the electronic component is a chip cap capacitor, and the first and second electrode layers are respectively disposed on first and second ends of the body and exposing sidewalls, and portions of a lower surface of the body.

17. The semiconductor package assembly as claimed in claim 13, wherein the first semiconductor package further comprises a second semiconductor die entirely embedded in the first RDL structure.

18. The semiconductor package assembly as claimed in claim 13, wherein the first semiconductor package further comprises a plurality of first conductive structures disposed on the second surface of the first RDL structure and electrically coupled to the first RDL structure.

19. The semiconductor package assembly as claimed in claim 18, further comprising a printed circuit board electrically coupled to the plurality of first conductive structures.

20. The semiconductor package assembly as claimed in claim 13, wherein the first semiconductor package comprises:

a second RDL structure disposed on the first semiconductor die and the first molding compound, such that the second RDL structure is separated from the first RDL structure by the first semiconductor die and the first molding compound; and a plurality of first vias passing through the first molding compound to form an electrical connection between the first and second RDL structures.

21. The semiconductor package assembly as claimed in claim 20, further comprising:

a second semiconductor package stacked on the first semiconductor package, comprising:

a third RDL structure electrically coupled to the second RDL structure and having a third surface and a fourth surface opposite thereto;

a third semiconductor die disposed on the third surface of the third RDL structure; and a second molding compound disposed on the third surface of the third RDL structure and surrounding the third semiconductor die.

22. The semiconductor package assembly as claimed in claim 21, wherein the second semiconductor package further comprises a plurality of second conductive structures disposed on the fourth surface of the third RDL structure and electrically coupled to the second RDL structure.

23. The semiconductor package assembly as claimed in claim 21, wherein the first semiconductor package is an SOC package, and the second semiconductor package is a DRAM package.

24. The semiconductor package assembly as claimed in claim 13, wherein the first semiconductor package further comprises a fourth semiconductor die disposed on the first surface of the first RDL structure, such that the first and fourth semiconductor dies are arranged side-by-side.

25. The semiconductor package assembly as claimed in claim 24, wherein the first semiconductor die is a SOC die, and the fourth semiconductor die is a DRAM die.

* * * * *

UNITED STATES PATENT AND TRADEMARK OFFICE
CERTIFICATE OF CORRECTION

PATENT NO. : 10,217,724 B2
APPLICATION NO. : 15/047980
DATED : February 26, 2019
INVENTOR(S) : Tzu-Hung Lin et al.

Page 1 of 1

It is certified that error appears in the above-identified patent and that said Letters Patent is hereby corrected as shown below:

In the Claims

Column 11, Claim 15, Line 34 should read: --electrode layers--.

Signed and Sealed this
Twentieth Day of August, 2019

Andrei Iancu
*Director of the United States Patent and Trademark Office*